(12) United States Patent
Pham et al.

(10) Patent No.: US 9,972,743 B1
(45) Date of Patent: May 15, 2018

(54) METHODS OF PRODUCING PHOTOELECTRIC DEVICES

(71) Applicant: Aptos Energy, LLC, Sunnyvale, CA (US)

(72) Inventors: Thanh Ngoc Pham, San Jose, CA (US); Joe Feng, Cupertino, CA (US)

(73) Assignee: Aptos Energy, LLC, Sunnyvale, CA (US)

( * ) Notice: Subject to any disclaimer, the term of this patent is extended or adjusted under 35 U.S.C. 154(b) by 0 days. days.

(21) Appl. No.: 15/268,446

(22) Filed: Sep. 16, 2016

Related U.S. Application Data

(63) Continuation-in-part of application No. 15/268,208, filed on Sep. 16, 2016, and a continuation-in-part of application No. 15/263,031, filed on Sep. 12, 2016, and a continuation-in-part of application No. 15/267,979, filed on Sep. 16, 2016.

(60) Provisional application No. 62/369,923, filed on Aug. 2, 2016.

(51) Int. Cl.
*H01L 21/00* (2006.01)
*H01L 31/20* (2006.01)
*H01L 31/18* (2006.01)
*H01L 31/0236* (2006.01)

(52) U.S. Cl.
CPC ...... *H01L 31/202* (2013.01); *H01L 31/02363* (2013.01); *H01L 31/1884* (2013.01)

(58) Field of Classification Search
CPC .............................. Y02E 10/50; Y02P 70/521
See application file for complete search history.

(56) References Cited

U.S. PATENT DOCUMENTS

| 5,876,838 | A | 3/1999 | Mallon |
| 2002/0069911 | A1 | 6/2002 | Nakamura et al. |
| 2009/0242019 | A1* | 10/2009 | Ramamoorthy .... H01L 31/0236 136/255 |
| 2010/0193021 | A1* | 8/2010 | Park ................. H01L 31/02246 136/256 |
| 2013/0102133 | A1 | 4/2013 | Sheng et al. |
| 2015/0228814 | A1* | 8/2015 | Matsuyama ...... H01L 31/02246 136/256 |

OTHER PUBLICATIONS

EPO Application 17184230.5, Extended European Search Report, dated Dec. 12, 2017, 8 pages.
Strahm et al., "Uniformity and Quality of Monocrystalline Silicon Passivation by Thin Intrinsic Amorphous Silicon in a New Generation Plasma-enhanced Chemical Vapor Deposition Reactor", MRS Proceedings, vol. 1245, Jan. 1, 2010, 6 pages.

* cited by examiner

*Primary Examiner* — Charles Garber
*Assistant Examiner* — Abdulfattah Mustapha
(74) *Attorney, Agent, or Firm* — Royse Law Firm, PC

(57) ABSTRACT

A photovoltaic device includes an intrinsic layer having two or more sublayers. The sublayers are intentionally deposited to include complementary concave and convex shapes. The sum of these layers resulting in a relatively flat surface for deposition of n- or p-doped layers. The photovoltaic device is optionally bifacial.

19 Claims, 4 Drawing Sheets

METHODS OF PRODUCING PHOTOELECTRIC DEVICES

CROSS-REFERENCE TO RELATED APPLICATION

This application is a continuation-in-part of U.S. non-provisional patent application Ser. No. 15/268,208 filed Sep. 16, 2016, this application is a continuation-in-part of U.S. non-provisional patent application Ser. No. 15/263,031 filed on Sep. 12, 2016, this application is a continuation-in-part of U.S. non-provisional patent application Ser. No. 15/267,979 filed on Sep. 16, 2016, this application also claims priority to U.S. provisional application Ser. No. 62/369,923 filed Aug. 2, 2016. The disclosures of these patent applications are hereby incorporated herein by reference.

BACKGROUND

Field of the Invention

The invention is the field of photovoltaic devices.

Related Art

Photovoltaic devices include multiple layers of semiconductor materials. In devices that include heterojunctions these layers are often produced using vacuum deposition techniques. A heterojunction is the interface that occurs between two layers or regions of dissimilar crystalline semiconductors. These semiconducting materials have unequal band gaps as opposed to a homojunction.

SUMMARY

One of the difficulties in the manufacture of large area photovoltaic devices is the deposition of layers that meet uniformity requirements over the entire device. This is particularly a problem when multiple wafers are processed in a batch and/or when layers are particularly thin. For example, in many photovoltaic devices an "intrinsic layer" is used to passivate a wafer substrate prior to deposition of doped semiconductor layers. The thinness of the intrinsic layer is limited by the uniformity of the deposition technique. If a deposition technique results in more material being deposited in one area of the device relative to another area of the device, enough intrinsic layer must be deposited such that proper coverage (e.g., passivation) is achieved even in areas where the least amount of material is deposited. In various embodiments of the invention, a deposition process including two or more separate steps is used to achieve a greater uniformity in deposition relative to each layer considered individually. This approached is applicable to both single wafer and batch wafer processing.

The invention includes an optionally bifacial photovoltaic device. The device is typically a heterojunction device and includes a wafer substrate, one or more "intrinsic" layer, and at least p- and n-doped layers. In various embodiments, the "intrinsic" layer, disposed between the wafer substrate and the p- and n-doped layers, is formed itself from multiple layers. These layers of the intrinsic layer are referred to as a first absorber layer and a second absorber layer, etc. These layers are intentionally formed such that the interface between them is curved, e.g., the amount of material in these layers is intentionally non-uniform. However, the sum of the first and second absorber layers is less curved relative to their interface. The sum of two layers that are intentionally non-uniform is shown to result in an overall uniformity that is greater than otherwise achieved.

The first absorber layer is deposited to produce a curved surface that is either concave or convex. The second absorber layer is deposed such that its thickness changes in a complementary manner. For example, if the first absorber layer is convex then the second absorber layer is concave. It has been demonstrated that with the precision and/or accuracy at which a concave and convex surfaces can be deposited is sufficiently greater than the precision and/or accuracy at which a single flat surface can be deposited. Thus, the combination of the first and second absorber layers produces a net flatter surface than the deposition of a single "flat" surface.

In various embodiments, the division of an "intrinsic" layer into two or more layers optionally provides additional advantages. For example, the composition of the two or more layers may be different.

Various embodiments of the invention include a photovoltaic device comprising: a wafer substrate; a first absorber layer disposed on a first side of the wafer substrate; a second absorber layer, the first absorber layer being disposed between the wafer substrate and the second absorber layer, the first and second absorber layer sharing a first curved interface; a p-doped layer, a boundary between the second absorber layer and the p doped layer being flatter than the first curved interface; a first transparent conductive layer, the p-doped layer being disposed between the first transparent conductive layer and the wafer substrate; front conductors in contact with the transparent conductive layer; and rear conductors disposed on a second side of the wafer substrate.

Various embodiments of the invention include a photovoltaic device comprising: a wafer substrate; a first absorber layer disposed on a first side of the wafer substrate; a second absorber layer, the first and second absorber layers in combination forming an intrinsic layer, the first absorber layer being disposed between the wafer substrate and the second absorber layer, wherein a uniformity of a thickness of the intrinsic layer is greater than a uniformity of a thickness of the first absorber layer; a p-doped layer; a first transparent conductive layer, the p-doped layer being disposed between the first transparent conductive layer and the wafer substrate; front conductors in contact with the transparent conductive layer; and rear conductors disposed on a second side of the wafer substrate.

Various embodiments of the invention include a method of producing a photovoltaic device, the method comprising: receiving a first wafer substrate; depositing a first absorber layer on the first wafer substrate, the deposition being performed to produce a controlled variation in a thickness of the first absorber layer; depositing a second absorber layer on the first absorber layer, the deposition being performed to produce a controlled variation in a thickness of the second absorber layer; depositing a p-doped layer on the second absorber layer, wherein the variation in the thickness of the first absorber layer and the variation in the thickness of the second absorber layer in combination result in a first boundary between the second absorber layer and the p-doped layer being flatter than a second boundary between the first absorber layer and the second absorber layer; and depositing a first transparent conductive layer on the p-doped layer.

Various embodiments of the invention include a method of producing a photovoltaic device, the method comprising: receiving a first wafer substrate; depositing a first absorber layer on the first wafer substrate, the deposition being performed to produce a controlled variation in a thickness of the first absorber layer; depositing a second absorber layer on the first absorber layer, the deposition being performed to produce a controlled variation in a thickness of the second absorber layer, wherein a uniformity of the thickness of a first absorber layer is less than a uniformity of a sum of the thickness of the first absorber layer and the thickness of the second absorber layer; depositing a p-doped layer on the second absorber layer; and depositing a first transparent conductive layer on the p-doped layer.

DETAILED DESCRIPTION

Figure 1:
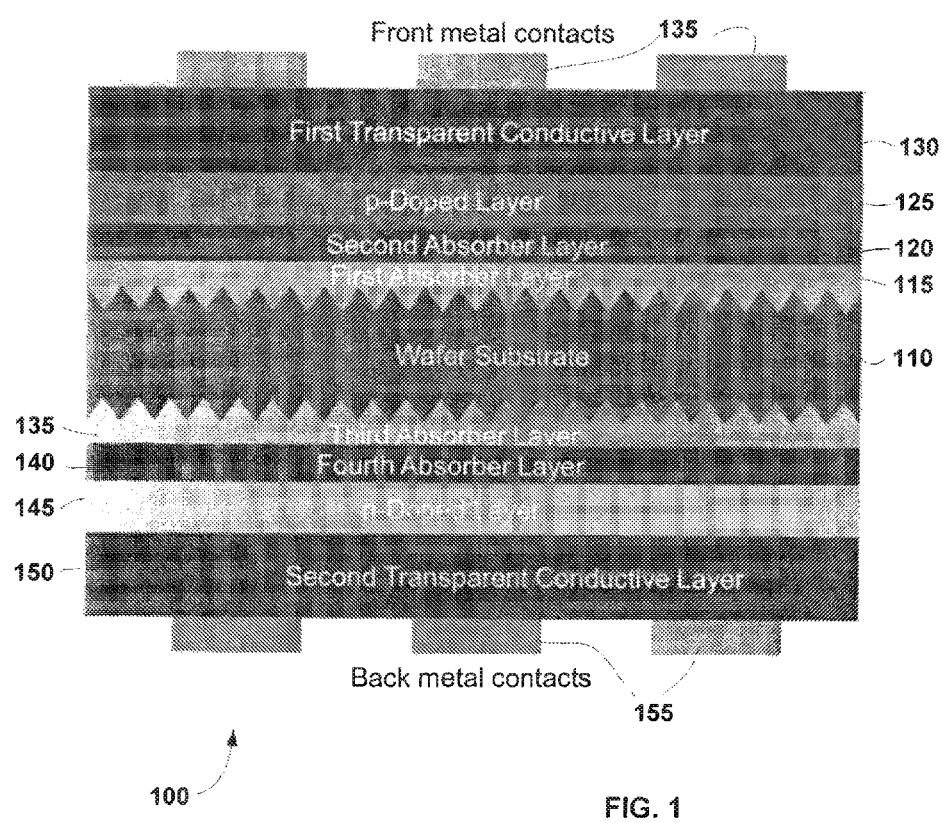
FIG. 1 is an illustration of a multilayer photovoltaic device, according to various embodiments of the invention.

FIG. 1 is an illustration of a multilayer Photovoltaic Device 100, according to various embodiments of the invention. Photovoltaic Device 100 includes a Wafer Substrate 110 on which other layers are deposited. Wafer Substrate 110 is optionally a silicon wafer including etched or roughened surfaces. Wafer Substrate 110 includes materials configured to produce charge pairs on the absorption of a photon of solar wavelengths. In various embodiments, Wafer Substrate 110 is at least 100, 125, 156 or 200 millimeter (or any range between these values) in length along the largest edge. Wafer Substrate 110 may have a pseudo square, round or polygonal shape. Photovoltaic Device 100 is optionally produced in a batch process. Examples of the materials that may be included in Wafer Substrate 110 include, but are not limited to, Silicon, Gallium Arsenide, Sapphire, and Silicon Carbide.

Photovoltaic Device 100 further includes a First Absorber Layer 115. First Absorber Layer 115 includes materials configured to passivate a surface of Wafer Substrate 110 and is at least partially transparent to solar wavelengths. As used herein the term "solar wavelengths" is intended to include wavelengths of light that are significantly energetic to produce charge pairs in a photovoltaic material. Examples of the materials that may be included in First Absorber Layer 115 include, but are not limited to, un-doped silicon, hydrogenated silicon, silicon doped with phosphorus, boron, or any element in Group 13 (Group III) or Group 15 (Group V) of the periodic table.

First Absorber Layer 115 is intentionally produced in a manner that results in a controlled curvature of the surface of First Absorber Layer 115 disposed opposite Wafer Substrate 110. This curvature is the result of different amounts of material being deposited at different locations, and may be concave or convex. Examples of approaches that may be used to produce such curvature include CVD (Chemical Vapor Deposition), ALD (Atomic Layer Deposition), and Epitaxial deposition. In various embodiments, the difference between the maximum thickness and minimum thickness of First Absorber Layer 115 is at least 1, 5, 15, 20, 30 or 45 Angstroms, or any range between these values. In various embodiments, the difference between the maximum thickness and minimum thickness of First Absorber Layer 115 is at least 1, 3, 5, 10 or 30 percent of the maximum thickness. The minimum thickness of First Absorber Layer 115 may be less than 5, 10, 50 or 100 angstroms, or any range between these values. In embodiments in which First Absorber Layer 117 is deposited in a batch process the curvature may be present (and measured) over several Wafer Substrates 110. In various embodiments, in the batch process, parts of Wafer Substrate 110 for different Photovoltaic Device 100 may be at least, 10, 15, 20, 25 or 50 cm from each other. The curvature may be over at least these distances, or any range there between. In various embodiments, at least 9, 12, 16, 20 or 25 wafer substrates are processed in a batch process in a same reaction chamber at the same time.

Photovoltaic Device 100 further includes a Second Absorber Layer 120. If First Absorber Layer 115 is convex, then Second Absorber Layer 120 is concave, and vice versa. The sum of First Absorber Layer 115 and Second Absorber Layer 120 can result in a surface of Second Absorber Layer 120 (distal to Wafer Substrate 110) that is significantly more uniform in thickness, e.g., flatter, than the boundary and/or interface between First Absorber Layer 115 and Second Absorber Layer 120. In fact, when properly produced, the net uniformity in thickness achieved by depositing two intentionally curved (non-uniform) layers can be greater than the uniformity achieved by the deposition of a single layer. The Second Absorber Layer 120 is deposited such that the First Absorber Layer 115 is disposed between Wafer Substrate 110 and Second Absorber Layer 120. In various embodiments, the thickness of the combined First and Second Absorber Layer 115 and 120 is uniform to within 1%, 3%, 5%, 10% or 15%, or any range between these values, using the above techniques. This uniformity can be achieved over a single Photovoltaic Device 100 and/or over a plurality of Photovoltaic Device 100 produced in a batch process. For example, in various embodiments, this uniformity is achieved over a batch of Photovoltaic Devices 100 occupying an area (including gaps between devices) of at least 0.67, 1.375, 2.7 or 5.5, square meters.

Figure 2A:
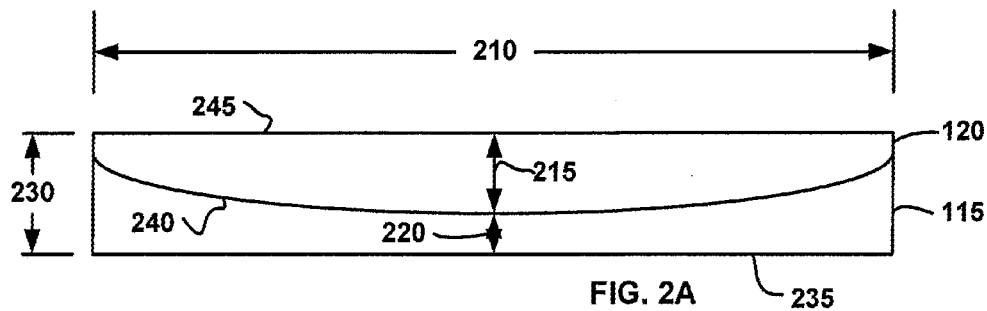
FIGS. 2A, 2B and 2C include detailed illustrations of absorber layers within the multilayer photovoltaic device, according to various embodiments of the invention.
Figure 2B:
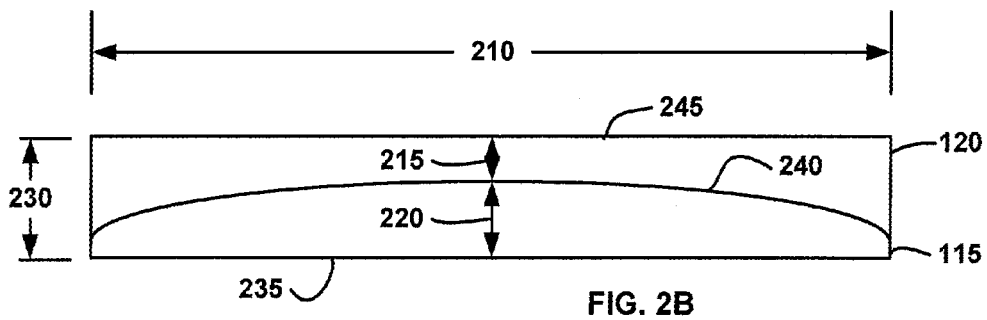
Figure 2C:
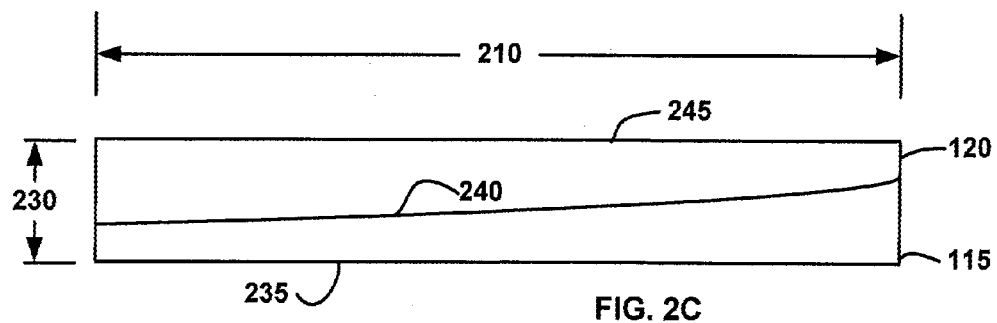

FIGS. 2A, 2B and 2C include detailed illustrations of the First and Second Absorber Layers 115 and 120 within the multilayer Photovoltaic Device 100, according to various embodiments of the invention. FIG. 2A illustrates embodiments in which First Absorber Layer 115 is convex and Second Absorber Layer 120 is concave. FIG. 2B illustrates embodiments in which First Absorber Layer 115 is concave and Second Absorber Layer 120 is convex. The curvatures and dimensions illustrated in FIGS. 2A-2C are greatly exaggerated for illustrative purposes. For example, the Net Thickness 230 of the combined First Absorber Layer 115 and the Second Absorber Layer 120 is typically on the order of 20-200 angstroms. While the Device Width 210 of Photovoltaic Device 100 can be on the order of 100-200 millimeter. The Net Thickness 230 is approximately a sum of Thickness 215 and Thickness 220 at any particular point on the layers. In various embodiments, Net Thickness 230 varies by less than 1%, 3%, 5% or 10%. In various embodiments, Net Thickness 230 is less than 0.2, 2, 10 or 20 angstroms. In various embodiments, the boundary between $2^{nd}$ Absorber Layer 120 and p-Doped Layer 125 is at least 5, 10, 25 or 50% more uniform than the boundary between $1^{st}$ Absorber Layer 115 and $2^{nd}$ Absorber Layer 120.

FIG. 2C illustrates First and Second Absorber Layers 115 and 120 wherein the curvature at their boundary is asymmetric. This situation, either convex or concave, can be found in Photovoltaic Devices 100 produced at an edge of a batch (See FIGS. 3A and 3B).

A Surface 235 of First Absorber Layer 115 is adjacent to Wafer Substrate 110. A Boundary 240 is disposed between First Absorber Layer 115 and the Second Absorber Layer 120 and forms a curved interface. First Absorber Layer 115 and the Second Absorber Layer 120 are optionally in direct contact at Boundary 240. A Surface 245 of Second Absorber Layer 120 is distal to Wafer Substrate 110. The uniformity (e.g., flatness) of Surface 245 is determined by the sum of the thicknesses of First Absorber Layer 115 and the Second Absorber Layer 120. By proper selection of deposition conditions, the flatness of Surface 245 may be significantly greater than the flatness of Boundary 240. In other words, the sum of the First and Second Absorber Layers (115 and 120) may be significantly more uniform in thickness relative to each of the First and Second Absorber Layers (115 and 120) considered separately.

Referring again to FIG. 1, Photovoltaic Device 100 further includes a p-Doped Layer 125 and a Transparent Conductive Layer 130. P-Doped Layer 125 is disposed between Transparent Conductive Layer 130 and Second Absorber Layer 120. p-Doped Layer 125 includes a p-dopant configured to accept electrons from Wafer Substrate 110, e.g., from charge pairs generated by absorption of a photon. Transparent Conductive Layer 130 is transparent to solar wavelengths and is configured to conduct electrons captured by p-Doped Layer 125 to Metal Contacts 135. Transparent Conductive Layer 130 optionally includes a metal oxide. Such p-doped layers and transparent conductive layers are well known in the art of photovoltaics. Example p-dopants include Boron, Aluminum, Nitrogen, Indium, Gallium, Tin and Lead. Seeding of Second Absorber Layer 120 with a dopant allows p-Doped Layer 125 to grow from nucleation sites.

The curvature of First Absorber Layer 115 and Second Absorber Layer 120 are complementary, e.g., they are opposite in direction. As such, a boundary between Second Absorber Layer 120 and p-Doped Layer 125 is flatter than Boundary 240 between First Absorber Layer 115 and Second Absorber Layer 120. Further, as the uniformity of the combined First and Second Absorber Layers 115 and 120 is improved relative to passivation using a single intrinsic layer, it is possible to have a thinner intrinsic layer and still assure passivation of the entire Wafer Substrate 110 surface. Further, adequate uniformity in net layer thickness can be maintained over a wider area. This permits larger scale batch processing.

Photovoltaic Device 100 optionally further includes a Third Absorber Layer 135 and a Fourth Absorber Layer 140. Third Absorber Layer 135 and a Fourth Absorber Layer 140 optionally have properties (e.g., structure, dimensions and materials) similar to First Absorber Layer 115 and Second Absorber Layer 120, respectively. Third Absorber Layer 135 and a Fourth Absorber Layer 140 are disposed on a side of Wafer Substrate 110 opposite from First Absorber Layer 115. Third Absorber Layer 135 is disposed between Wafer Substrate 110 and Fourth Absorber Layer 140. A curved interface, similar to Boundary 240 is found between Third Absorber Layer 135 and Fourth Absorber Layer 140. The uniformity in thickness of the combined Third and Fourth Absorber Layer 135 and 140 is greater than the uniformity of either of these two layers individually.

Photovoltaic Device 100 typically further includes an n-Doped Layer 145. Third Absorber Layer 135 and a Fourth Absorber Layer 140 may or may not be disposed between Waver Substrate 110 and n-Doped Layer 145. N-Doped Layer 145 includes an n-dopant configured provide electrons to electrons holes generated within Third Absorber Layer 135 and/or Fourth Absorber Layer 140. A boundary between Fourth Absorber Layer 140 and n-Doped Layer 145 is optionally flatter than a boundary (e.g., shared interface) between Third Absorber Layer 135 and Fourth Absorber Layer 140. Example n-dopants include Nitrogen, Phosphorus, Arsenic, Antimony, Bismuth and Lithium. In addition Germanium, xenon, gold and platinum may be used in n-Doped Layer 145 and/or p-Doped Layer 125.

Photovoltaic Device 100 typically further includes a Second Transparent Conductive Layer 150. Second Transparent Conductive Layer 150 is configured to conduct electrons between n-Doped Layer 145 and Back Metal Contacts 155. Second Transparent Conductive Layer 150 may include materials similar to those that can be included in First Transparent Conductive Layer 130. In alternative embodiments Second Transparent Conductive Layer 150 is replaced by a reflective conductive layer. This reflective conductive layer can include a metal such as copper, silver, aluminum or nickel, nickel vanadium, gold, platinum. The reflective conductive layer is configured to reflect light of solar wavelengths back toward Wafer Substrate 110.

In some embodiments, First Absorber Layer 115 and Second Absorber Layer 120 comprise the same materials. These materials can be at the same or different concentrations. Alternatively, the concentrations of the materials in First Absorber Layer 115 and Second Absorber Layer 120 may be different. For example, Second Absorber Layer 120 may include a form of silicon having a different index of refraction relative to First Absorber Layer 115. Second Absorber Layer 120 may include more or less amorphous form of silicon (as compared to crystalline and measured by refractive index) relative to First Absorber Layer 115. Second Absorber Layer 120 may include a higher proton concentration relative to First Absorber Layer 115. Second Absorber Layer 120 may include a seed material, e.g., boron, configured to facilitate the deposition of p-Doped Layer 125. This seed material optionally includes a p-dopant included in p-Doped Layer 125. The seed material may be deposited using diborane, $B_2H_6$, trimethyl/borate, and/or the like. In various embodiments, Second Absorber Layer 120 and/or First Absorber Layer 115 include a concentration gradient. For example, Second Absorber Layer 120 may include a gradient of p-dopant material, the concentration of the p-dopant mater being less proximate to p-Doped Layer 125. Optionally, the Second Absorber Layer 120 includes a greater amount of p-dopant relative to the First Absorber Layer 115. An example of a p-dopant gradient is discussed elsewhere herein.

In some embodiments, the differences between the discussion herein of the materials and structures of First Absorber Layer 115 and Second Absorber Layer 120 are optionally also applied to Third Absorber Layer 135 and Fourth Absorber Layer 140, respectively. For example, Forth Absorber Layer 140 may include a seed material configured to facilitate the deposition of n-Doped Layer 145. This seed material can include an n-dopant material of n-Doped Layer 145.

In some embodiments the material differences between First Absorber Layer 115 and Second Absorber Layer 120 make the material of the Second Absorber Layer 120 less transparent to solar wavelengths relative to the material of the First Absorber Layer 115. For example, in some embodiments it is desirable to add material to the Second Absorber Layer 120 that make this layer more resilient to damage during the deposition of the p-Doped Layer 125. A cost of this resilience may be a reduced material transparency. By forming the intrinsic layer from two distinct layers (115 and 120), this cost can be confined to the Second Absorber Layer 120.

Figure 3A:
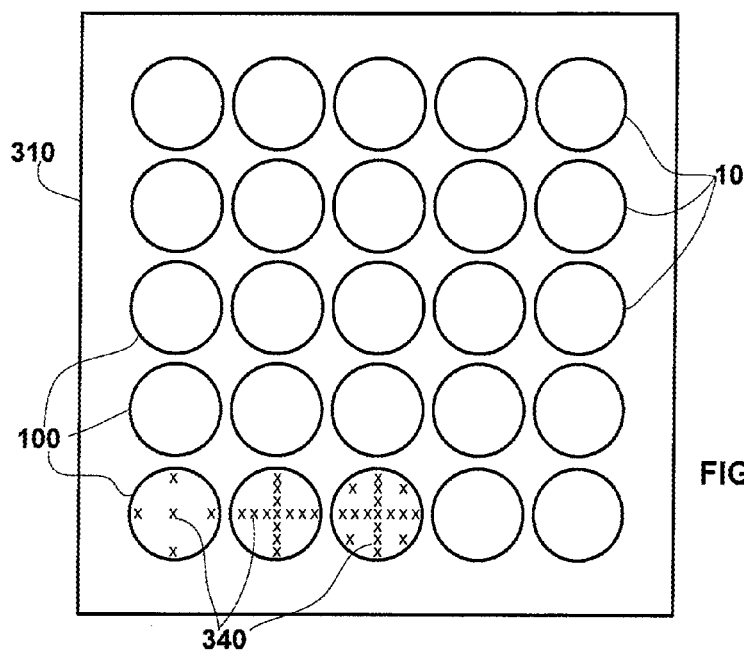
FIGS. 3A and 3B illustrate detailed illustrations of multilayer photovoltaic devices in a batch process, according to various embodiments of the invention.
Figure 3B:
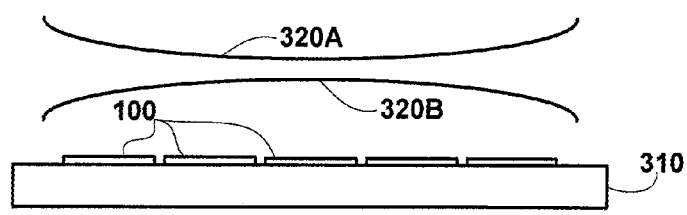

FIGS. 3A and 3B illustrate detailed illustrations of multilayer Photovoltaic Devices 100 in a batch process, according to various embodiments of the invention. In such a process, more than one Photovoltaic Device 100 is produced on a single Platform 310. Platform 310 may be configured to hold at least 9, 12, 16, 20, 25, 64, 100, or 210 Photovoltaic Devices 100 at once, (or any range between these values). Each of these Photovoltaic Devices 100 typically include a separate Wafer Substrate 110, that are processed in a batch process at the same time. The Photovoltaic Devices 100 may be of any shape and can be arrayed in a square as shown or in any appropriate packing pattern. During production of Photovoltaic Devices 100 on Platform 310, maximum distances between parts of the produced Photovoltaic Devices 100 may be as least 0.1, 1, 5, 10, 50 or 100 millimeter, or any range between these values. In various embodiments, these distances are maintained while maintaining a batch uniformity in thickness of the combined First and Second Absorber Layers 115 and 120 of at least 1%, 2%, 5% or 10%. As used herein, the term "batch uniformity" is used to specify the uniformity in thickness of the sum these layers over all the Photovoltaic Devices 100 in a batch. In contrast, "wafer uniformity" is used to specify the uniformity of the thickness of the sum of these layers over a single Photovoltaic Device 100. Multiple Photovoltaic Devices 100 are optionally disposed on Platform 310 during deposition of any one or more of the various layers illustrated in FIG. 1. In various embodiments, the average total thickness of the First and Second Absorber Layers (115 & 120) is less than 30, 40, 50, 55 or 60 angstroms. This average may be over a single Photovoltaic Device 100 or a batch thereof.

Wafer uniformity is determined by measuring thickness of a layer at several points on a wafer and then calculating the wafer uniformity to by the formula:

((Max Thickness)−(Min Thickness))/(2×Average Thickness)

In some industry standards the thickness at a minimum of 5 points is measured. In other approaches 9 or 13 points are measured. Possible measurement point Locations 340 are illustrated in FIG. 3A with an "X". The uniformity values recited herein are based on measurements at these example locations, or similar locations adapted for Wafer Substrates 110 of different shapes. Batch uniformity is calculated by first determining the wafer uniformity for each Photoelectric Device 100 in a batch. The difference between the maximum wafer uniformity and the minimum wafer uniformity is then divided by two times the average wafer uniformity (in an equation similar to that shown above).

When Photovoltaic Devices 100 are produced in a batch, the variation in layer deposition thickness may vary over the entire batch. The Curves 320A and 320B are graphic illustrations of such variation. Curve 320A illustrates a concave deposition function in which relatively greater thickness is found at the edges of a batch. Curve 320B illustrates a convex deposition function in which a relatively greater thickness is found near the center of a batch. (The heights of the illustrated Curves 320A and 320B are greatly exaggerated for illustrative purposes, relative to the Photovoltaic Devices 100 shown in FIG. 3B.) These deposition functions may produce First and Second Absorber Layers 115 and 120 such as illustrated in FIG. 2C. The two complementary deposition functions (of First and Second Absorber Layers 115 and 120) provide a greater batch uniformity in the thickness of an intrinsic layer over several Photovoltaic Devices 100, as compared to deposition of an intrinsic layer in a single step.

Figure 4:
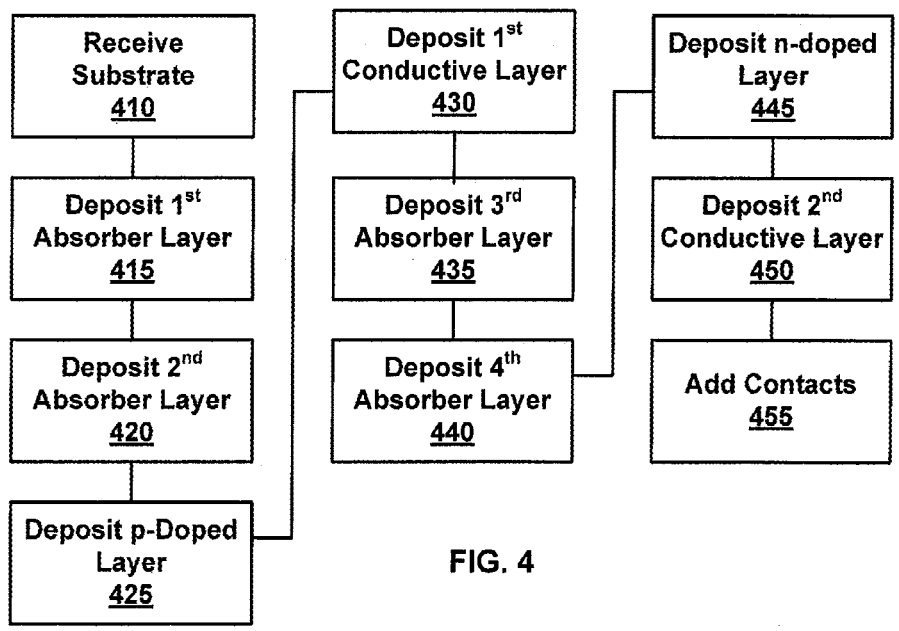
FIG. 4 illustrates methods of producing a multilayer photovoltaic device, according to various embodiments of the invention.

FIG. 4 illustrates methods of producing multilayer Photovoltaic Device 100, according to various embodiments of the invention. The produced device may be single- or bifacial. As is discussed elsewhere herein, an intrinsic layer is produce using two or more separate absorber layers. These two or more layers are typically produced in distinct steps.

In a Receive Substrate Step 410, Wafer Substrate 110 is received. Wafer Substrate 110 may be etched to produce a rough surface for light entrapment.

In a Deposit 1$^{st}$ Absorber Layer Step 415, First Absorber Layer 115 is deposited on Wafer Substrate 110. The deposition is typically performed using techniques known in the art of semiconductor manufacturing. For example, CVD, ALD or Epitaxial deposition. First Absorber Layer 115 is intentionally deposited to form a concave or convex shape. This shape may be present over a single Photovoltaic Device 100 and/or a batch of Photovoltaic Devices 100. The shape (convex or concave) of First Absorber Layer 115 is reproducibly controlled.

In a Deposit 2$^{nd}$ Absorber Layer Step 420, Second Absorber Layer 120 is deposited such that First Absorber Layer 115 is disposed between Wafer Substrate 110 and Second Absorber Layer 120. Second Absorber Layer 120 is intentionally deposited to form a convex or concave shape that is complementary to the same of First Absorber Layer 115. The variation in the thickness of Second Absorber Layer 120 is controlled to produce Surface 245 on the side of Second Absorber Layer 120 distal to Wafer Substrate. The flatness of Surface 245 is dependent on the uniformity in thickness of the combined First and Second Absorber Layers 115 and 120. The thickness of the combined First and Second Absorber Layers 115 and 120 is optionally uniform as measured over an entire batch of Photovoltaic Devices 100.

Second Absorber Layer 120 is optionally deposited using different conditions than the deposition of First Absorber layer 115. The condition differences can include temperature, pressure, excitation power, gas glows, gas distribution and plate to substrate surface spacing.

In some embodiments Photovoltaic Device 100 is moved between reaction chambers between Step 415 and Step 420. In some embodiments, a reaction chamber within which Step 415 occurs is evacuated prior to Step 420. Step 420 is then performed using different conditions as discussed elsewhere herein.

In a Deposit p-Doped Layer Step 425, p-Doped Layer 125 is deposited on Second Absorber Layer 120. The variation in the thickness of First Absorber Layer 115 and in the thickness of the Second Absorber Layer 120 results in a boundary at Surface 245 that is flatter than Boundary 240 between the First Absorber Layer 115 and the Second Absorber Layer 120. As noted above Surface 245 is at an interface between p-Doped Layer 125 and Second Absorber Layer 120. A seed layer (not shown) is optionally deposited between p-Doped Layer 125 and Second Absorber Layer 120.

In a Deposit 1$^{st}$ Conductive Layer Step 430, First Transparent Conductive Layer 130 is deposited on p-Doped Layer 125. As described elsewhere herein, First Transparent Conductive Layer 130 is preferably highly transparent to solar wavelengths.

In a Deposit 3$^{rd}$ Absorber Layer Step 435, Third Absorber Layer 135 is deposited on a side of Wafer Substrate 110 opposite First Absorber Layer 115. In an optional Deposit 4$^{th}$ Absorber Layer Step 440, Fourth Absorber Layer 140 is deposited on Third Absorber Layer 135. The deposition of Third Absorber Layer 135 and Fourth Absorber Layer 140 are performed using methods similar to those used in Deposit 1$^{st}$ Absorber Layer 415 and Deposit 2$^{nd}$ Absorber Layer 420. For example, these layers are deposited to produce curved distributions in thickness for each layer, which results in a more uniform total thickness. The deposition of Fourth Absorber Layer 140 is performed such that a side of Fourth Absorber Layer 140 proximate to n-Doped Layer 145 is flatter than a side of the fourth Absorber Layer 140 proximate to Third Absorber Layer 135. Typically, the thickness of the combination of Third Absorber Layer 135 and Fourth Absorber Layer 140 is more uniform than the thickness of Third Absorber Layer 135 alone.

In a Deposit n-Doped Layer Step 445, n-Doped Layer 145 is deposited on a side of Wafer Substrate 110 opposite p-Doped Layer 125. This deposition may be performed using various techniques described herein.

In a Deposit 2$^{nd}$ Conductive Layer Step 450, Second Transparent Conductive Layer 150 is deposited adjacent to n-Doped Layer 145. In alternative embodiments, Transparent Conductive Layer 150 includes a layer that is more reflective than transparent to solar wavelengths.

In an Add Contacts Step 455, Metal Contacts 135 and 155 are added on the layers deposited in Steps 430 and 450. These Metal Contacts 135 and 155 enable electrical connections to Photovoltaic Device 110.

Figure 5A:
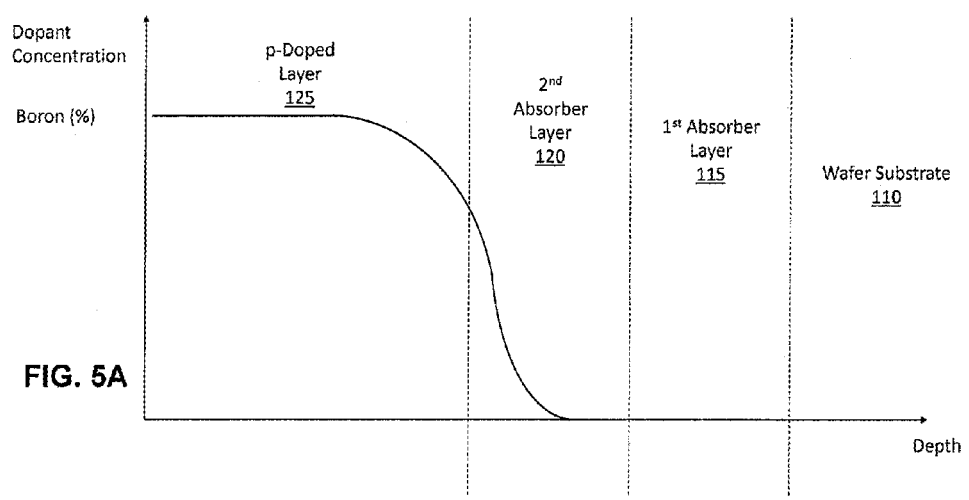
FIGS. 5A and 5B illustrate dopant concentration gradients, according to various embodiments of the invention.
Figure 5B:
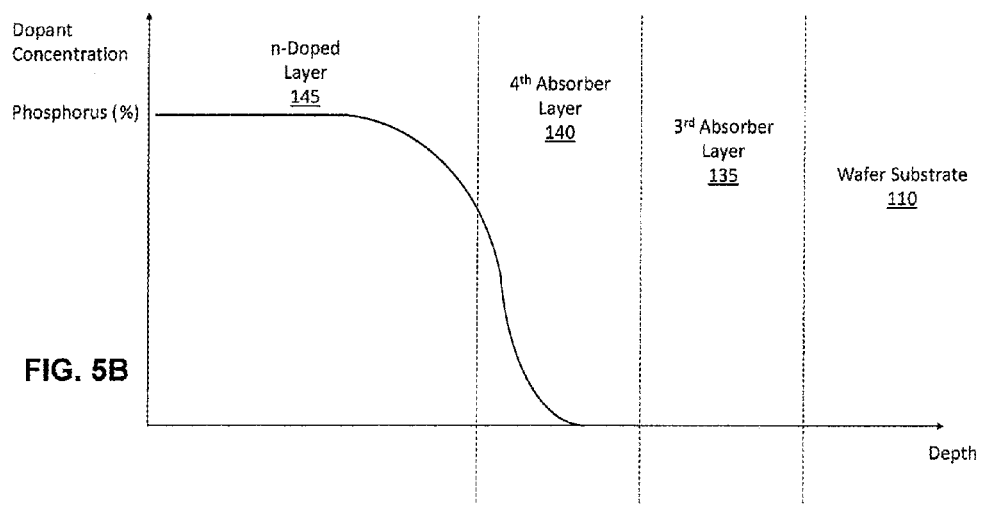

FIGS. 5A and 5B illustrate a dopant concentration gradient, according to various embodiments of the invention. Example, concentrations of p- and n-dopant materials in p-Doped Layer 125, Second Absorber Layer 120, n-Doped Layer 145 and Fourth Absorber Layer 140 are shown.

Several embodiments are specifically illustrated and/or described herein. However, it will be appreciated that modifications and variations are covered by the above teachings and within the scope of the appended claims without departing from the spirit and intended scope thereof. For example, the disclosed approach to improving the uniformity of layers may be applied to device layers other than the intrinsic layers of photovoltaic devices. Additional minor intermediate layers may be disposed between those illustrated in FIG. 1. References to depositing a first layer "on" a second layer may include such intermediate layers between the first and second layers—the first and second layers are still considered "on" each other. Finally, the techniques disclosed herein may be applied to other types of devices such as displays and imaging semiconductors. These techniques are optionally used to produce these products in larger batches than would otherwise be economical. While Wafer Substrate 110 is typically flat, in some embodiments a curved device is produced by starting with a curved substrate. In these embodiments the "flatness" of a layer is considered the degree of match between that layer and the shape of the substrate. Further, while the examples provided herein include a p-doped layer on the "front" of the device and an n-doped layer on the "back," the location of these layers, their respective dopants and the order of steps, may be reversed.

The embodiments discussed herein are illustrative of the present invention. As these embodiments of the present invention are described with reference to illustrations, various modifications or adaptations of the methods and or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is understood that the present invention is in no way limited to only the embodiments illustrated.

What is claimed is:

1. A method of producing a photovoltaic device, the method comprising:
    receiving a first wafer substrate;
    depositing a first absorber layer on the first wafer substrate, the deposition being performed to produce a controlled variation in a thickness of the first absorber layer;
    depositing a second absorber layer on the first absorber layer, the deposition being performed to produce a controlled variation in a thickness of the second absorber layer, wherein a uniformity of the thickness of a first absorber layer is less than a uniformity of a sum of the thickness of the first absorber layer and the thickness of the second absorber layer;
    depositing a first doped layer on the second absorber layer;
    depositing a first transparent conductive layer on the first doped layer
    depositing a third absorber layer on a side of the wafer substrate opposite the first absorber layer;
    depositing a fourth absorber layer on the third absorber layer; and
    depositing a second doped layer on the fourth absorber layer, wherein deposition of the fourth absorber layer is performed such that a side of the fourth absorber layer proximate to the second doped layer is flatter than a side of the fourth absorber layer proximate to the third absorber layer.

2. The method of claim 1, further comprising depositing a second transparent conductive layer on the second doped layer.

3. The method of claim 1, further comprising depositing a reflective transparent conductive layer on the second doped layer.

4. The method of claim 1, wherein the first doped layer is p-doped and the second doped layer is n-doped.

5. The method of claim 1, wherein the first doped layer is n-doped and the second doped layer is p-doped.

6. The method of claim 1, wherein the second absorber layer has a greater refractive index than the first absorber layer.

7. The method of claim 1, wherein the first absorber layer is deposited at conditions to make the first absorber layer concave.

8. The method of claim 1, wherein the first absorber layer is deposited at conditions to make the first absorber layer convex.

9. The method of claim 1, further comprising texturing the substrate wafer.

10. A method of producing a photovoltaic device, the method comprising:
    receiving a first wafer substrate;
    depositing a first absorber layer on the first wafer substrate, the deposition being performed to produce a controlled variation in a thickness of the first absorber layer;
    depositing a second absorber layer on the first absorber layer, the deposition being performed to produce a controlled variation in a thickness of the second absorber layer, wherein a uniformity of the thickness of a first absorber layer is less than a uniformity of a sum of the thickness of the first absorber layer and the thickness of the second absorber layer;

depositing a first doped layer on the second absorber layer;

depositing a first transparent conductive layer on the first doped layer; and receiving at least a second wafer substrate, wherein the step of depositing the first absorber layer is performed on both the first and second wafer substrates at the same time.

11. The method of claim 10, wherein a part of the first wafer substrate is at least 15 cm from a part of the second wafer substrate during the step of depositing the first absorber layer.

12. The method of claim 10, wherein the first and second wafer substrates are disposed on a same platform during the step of depositing the first absorber layer.

13. The method of claim 12, wherein the platform is configured to hold at least 9 wafer substrates during the step of depositing the first absorber layer.

14. The method of claim 1, wherein the controlled variation in a thickness of the first absorber layer includes a controlled variation in thickness across multiple wafer substrates.

15. The method of claim 14, wherein the controlled variation across multiple wafer substrates is over a length of at least 20 cm.

16. The method of claim 1, wherein the second absorber layer includes a seed material configured for depositing the first doped layer.

17. The method of claim 1, wherein the first doped layer is p-doped or n-doped.

18. The method of claim 1, wherein the first absorber layer is deposited to be convex and the second absorber layer is concave.

19. The method of claim 1, wherein the first absorber layer is deposited to be concave and the second absorber layer is convex.

* * * * *